United States Patent [19]

Levchenko et al.

[11] Patent Number: 5,016,566
[45] Date of Patent: May 21, 1991

[54] APPARATUS FOR FORMING FILMS BY EVAPORATION IN VACUUM

[76] Inventors: Georgy T. Levchenko, prospekt Svobody, 17B, kv. 104.; Alexandr Radzikovsky, ulitsa Cheshskaya, 9, kv.25., both of Kiev, U.S.S.R.

[21] Appl. No.: 458,674
[22] PCT Filed: Jan. 20, 1989
[86] PCT No.: PCT/SU89/00017
  § 371 Date: Jan. 24, 1990
  § 102(e) Date: Jan. 24, 1990
[87] PCT Pub. No.: WO89/12117
  PCT Pub. Date: Dec. 14, 1989

[30] Foreign Application Priority Data

May 31, 1988 [SU] U.S.S.R. ............... 4434256
Nov. 15, 1988 [SU] U.S.S.R. ............... 4601808
Nov. 15, 1988 [SU] U.S.S.R. ............... 4601810
Nov. 15, 1988 [SU] U.S.S.R. ............... 4601811
Nov. 15, 1988 [SU] U.S.S.R. ............... 4601812

[51] Int. Cl.⁵ ............................... C23C 14/26
[52] U.S. Cl. ......................... 118/726; 118/715; 118/719; 392/388
[58] Field of Search ............ 118/715, 719, 726; 219/271, 275

[56] References Cited

U.S. PATENT DOCUMENTS 3,572,672 3/1971 Harel .
4,700,660 10/1987 Levchenko et al. .

FOREIGN PATENT DOCUMENTS 397567 1/1974 U.S.S.R. .
1031524 7/1983 U.S.S.R. .
1257115 9/1986 U.S.S.R. .
1517085 7/1978 United Kingdom .

Primary Examiner—Richard Bueker
Attorney, Agent, or Firm—Fleit, Jacobson, Cohn, Price, Holman & Stern

[57] ABSTRACT

An apparatus for forming films by evaporation in vacuum has a chamber for evaporating a coating material containing a coating material (10), and a heating element (2) positioned outside this chamber. A collimating chamber (3), which is identically constructed, communicates with the chamber (1), and each of the chambers (1,3) has a pair of ports (4, 5) aligned on an axis (8), a socket pipe (6,7) being received in one of the ports, respectively, the socket pipe (6) of the evaporation chamber (1) being received in the port (5) of the collimating chamber (3), the evaporation chamber (1) having a sealing member (9) provided in the other port (4) of the chamber (1).

7 Claims, 1 Drawing Sheet

APPARATUS FOR FORMING FILMS BY EVAPORATION IN VACUUM

FIELD OF THE INVENTION

The invention relates to the technique of coating by evaporation in vacuum, and, more specifically, it deals with an apparatus for forming films by evaporation in vacuum.

An apparatus for forming films by evaporation in vacuum, preferably of valuable materials such as gold, silver, platinum, palladium may be used in the electronic and radio engineering and in acoustics, in the manufacture of e.g. integrated circuits as well as in metal coating and in tuning of quartz resonators in vacuum.

The most promising nowadays is a technique of forming films by evaporation on vertically positioned substrates as it is capable of ensuring maximum yield of normal grade products owing to an insignificant contamination of substrates in comparison with methods involving horizontal position of substrates. The main requirements imposed upon apparatuses for forming films by evaporation in vacuum are high uniformity of film thickness and low losses of a coating material with a simple construction of the apparatus.

BACKGROUND OF THE INVENTION

Known in the art is an apparatus for forming films by evaporation in vacuum (GB, B, 1517085), comprising a debiteuse containing a material being evaporated, the electric current flowing directly through the debiteuse for heating and evaporating a coating material. A substrate is placed horizontally opposite to the debiteuse and is spaced therefrom.

This apparatus is characterized by large losses of a coating material because of the absence of a directional flow of the evaporated material, and it can only be used for forming films on horizontal substrates.

For creating a directional flow of an evaporated material, nozzles are used, e.g. in an evaporator for vacuum plants (SU, A, 397567) having a heater accommodating a crucible containing a material to be evaporated and a nozzle provided in the top part of the crucible. A substrate is horizontally positioned and is aligned with the nozzle axis and spaced from the outlet edge of the nozzle.

This prior art evaporator also features availability of a boundary layer in the flow adjacent to the walls of the nozzle, the width of the boundary layer covering a substantial part of the flow with velocities of evaporated materials used in practice. Molecules emitted from this layer move chaotically and cause an increase in losses of a coating material.

A substantial reduction of losses of a coating material can be achieved by using the technique of solid phase recovery of an evaporated material that failed to get to the substrate as it is the case in an apparatus for forming films by evaporation in vacuum (U.S. Pat. No. 4,700,660), comprising a chamber for evaporating a coating material, a heating element provided outside the chamber, and a collimating chamber communicating therewith, each chamber of identical construction having two ports aligned on one and the same axis.

The chamber for evaporating a coating material and the collimating chamber comprise a pipeline having a transverse plane of symmetry. The bottom end of the evaporation chamber is positioned in a crucible containing a coating material. Both chambers may be separated by a diaphragm with an opening extending in the plane of symmetry.

The pipeline is turned over at regular intervals as the coating material is consumed and replenished and is placed in such a manner that it should be received in the crucible with an end thereof on which the coating material that failed to get to the substrate has been deposited. This material is used in the next evaporation cycle.

The abovedescribed apparatus is, however, suitable for forming films only on horizontally positioned substrates as the coating material can flow out through unsealed spots in the joint between the bottom end of the pipeline defining the evaporation chamber and the crucible. In addition, in the simplest versions of the apparatus in which the pipeline is of an integral construction and has an annular recess in the middle part separating the evaporation and collimating chambers, the material is always condensed in the annular recess zone with any position of the pipeline. The coating material collected in the annular recess would overflow to one of the chambers so as to cause an asymmetric change in distribution of intensity of vapour flow escaping from the collimating chamber thus lowering uniformity of thickness of the applied films.

In addition, this apparatus in its simplest form cannot ensure high uniformity of thickness of the applied film on large-area substrates even if they are positioned horizontally, and the use of various diaphragms provided for that purpose in the pipeline complicates construction of the apparatus.

In case rather thick films are to be formed, a layer of material condensed in the collimating chamber causes a change in distribution of intensity of vapour flow escaping therefrom thus lowering uniformity of film thickness.

Moreover, evaporation of the coating material simultaneously from the crucible and evaporation chamber which are generally at somewhat different temperatures results in a change in evaporation rate during evaporation: first evaporation of the material occurs at a higher rate from a stronger heated surface (evaporation chamber) and then the material evaporates at a lower rate from a less heated surface (crucible). For ensuring a parity between evaporation rates, it is necessary to control heating current during evaporation which makes the apparatus more complicated.

SUMMARY OF THE INVENTION

The invention is based on the problem of providing an apparatus for forming films by evaporation in vacuum having such a relative position of the evaporation and collimation chambers and such a construction thereof as to ensure film forming with uniform thickness and with low losses of a coating material with vertically positioned substrates.

The above problem is solved by that in an apparatus for forming films by evaporation in vacuum, comprising a chamber for evaporating a coating material having a heating element positioned outside thereof and communicating with a collimating chamber, both chambers being identically constructed and each having a pair of aligned ports, according to the invention, the axis of the ports extends horizontally, the chamber for evaporating a coating material and the collimating chamber are each provided with a pipe socket positioned in one of the ports, the pipe socket of the chamber for evaporating a coating material being received in the other port of the collimating chamber, the chamber for evaporating a coating material having a sealing member provided in the other port thereof, the coating material being contained directly in the chamber for evaporating a coating material.

The apparatus preferably has a directional vapour flow former comprising a rod aligned with the axis of the ports of the chamber for evaporating a coating material and attached to the sealing member thereof.

The distal end of the rod is preferably received in the pipe socket of the chamber for evaporating a coating material be define a space with its inner surface The distal end of the rod is preferably positioned adjacent to the inner surface of the pipe socket of the chamber for evaporating a coating material and has an axial passage and a plurality of ports in the periphery of the rod communicating therewith.

It is also preferred that the apparatus comprises an additional heating element extending outside, and along the periphery of the pipe socket of the collimating chamber.

The sealing member is preferably made integral with the main heating element.

The apparatus for forming films by evaporation in vacuum, according to the invention, makes it possible to carry out treatment of vertically positioned substrates thus enhancing uniformity of coated structures and increasing the yield of normal grade products. High uniformity of thickness of a coated film with a lower material consumption is thereby ensured. The apparatus is simple in construction and reliable in operation.

BRIEF DESCRIPTION OF THE DRAWINGS

The invention will now be described in detail with reference to specific embodiments illustrated in the accompanying drawings, in which.

BEST MODE OF CARRYING OUT THE INVENTION

Figure 1:
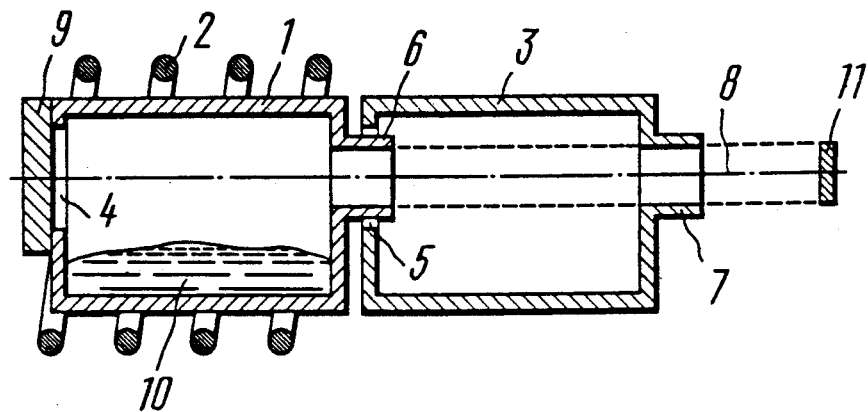
FIG. 1 schematically shows a general view of an apparatus for forming films by evaporation in vacuum in a longitudinal section view, according to the invention.

An apparatus for forming films by evaporation in vacuum comprises a chamber 1 (FIG. 1) for evaporating a coating material, a heating element 2 positioned outside thereof, and an identically constructed collimating chamber 3 communicating with the evaporation chamber. The chambers 1, 3 have ports 4, 5 and pipe sockets 6, 7. The ports 4, 5 and pipe sockets 6, 7 are aligned on one and the same horizontal axis 8 which in this embodiment of the apparatus extends somewhat above the axis of symmetry of the chambers 1, 3. To establish communication between the chambers 1 and 3, the pipe socket 6 of the evaporation chamber 1 is received in the port 5 of the collimating chamber 3. The evaporation chamber 1 has a sealing member 9 provided in the port 4, e.g. using a threaded joint (not shown in the drawing).

A coating material 10 is contained directly in the evaporation chamber 1 and its level should not be above the lower edge of the port 4.

The heating element 2 maintains a temperature for evaporation of the coating material 10 in the evaporation chamber 1, and temperature in the collimating chamber 3 is below melting point of the coating material 10. The chamber 3 is designed for a solid-phase recovery of the evaporated material 10 that failed to pass through the pipe socket 7.

A substrate 11 for forming a film thereon is positioned in a spaced relation to the outlet opening of the pipe socket 7 along the axis 8.

The identity of the chambers 1 and 3 makes it possible to exchange them so as to return the material 10 condensed in the collimating chamber 3 for re-evaporation.

The fact that the pipe socket 6 of the evaporation chamber 1 is received in the port 5 of the collimating chamber 3 rules out vapour ingress into the joint between the chambers 1, 3 so as to prevent the chambers 1, 3 from being soldered together with the melt of the coating material 10 and avoid losses of the coating material.

Figure 2:
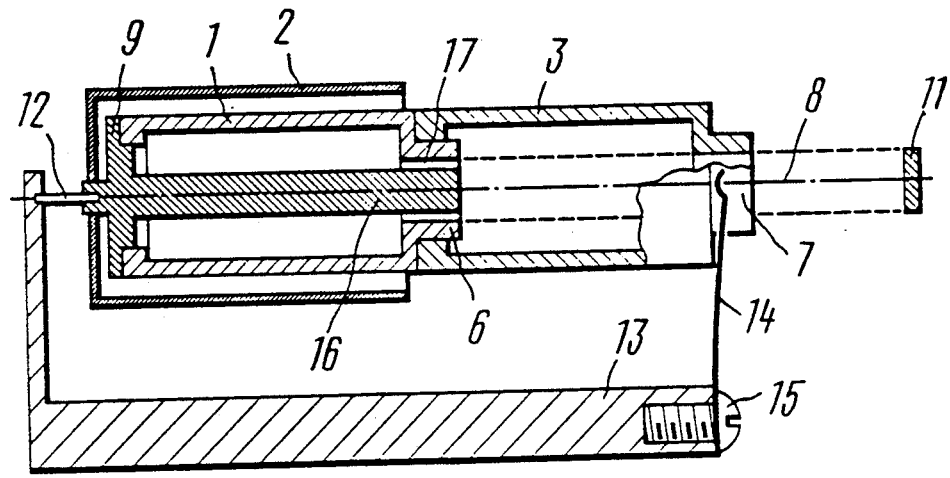
FIG. 2 is ditto of FIG. 1, with a former of a directional vapour flow in a longitudinal section view, according to the invention.

In this embodiment the sealing member 9 is mounted on a pin 12 (FIG. 2) attached to an arm 13 provided in a vaccum chamber (not shown in the drawing). The chambers 1 and 3 are pressed against the sealing member 9 by a spring 14 secured to the arm 13 by means of a screw 15 so as to ensure reliable sealing of the port 4 even with a thermal expansion of the sealing member 9 and evaporation chamber 1.

A directional vapour flow former in the form of a rod 16 extending along the axis 8 is provided on the sealing member 9. The distal end of the rod 16 is received in the pipe socket 6 with a space 17 defined therebetween. Vapour flow escaping through the annular space 17 ensures a more uniform thickness of a film formed on the substrate 11. The end of the rod 16 as well as the pipe socket 6 may have a different configuration, e.g. conical (not shown in the drawing) so as to ensure inuformity of film thickness on the substrate 11 of a large size.

The chambers 1, 3, sealing member 9 and rod 16 may be made of graphite or of a high melting metal such as molybdenum. The heating element 2 may also be made of a high-melting sheet metal and secured to current leads of the apparatus (not shown in the drawing).

Figure 3:
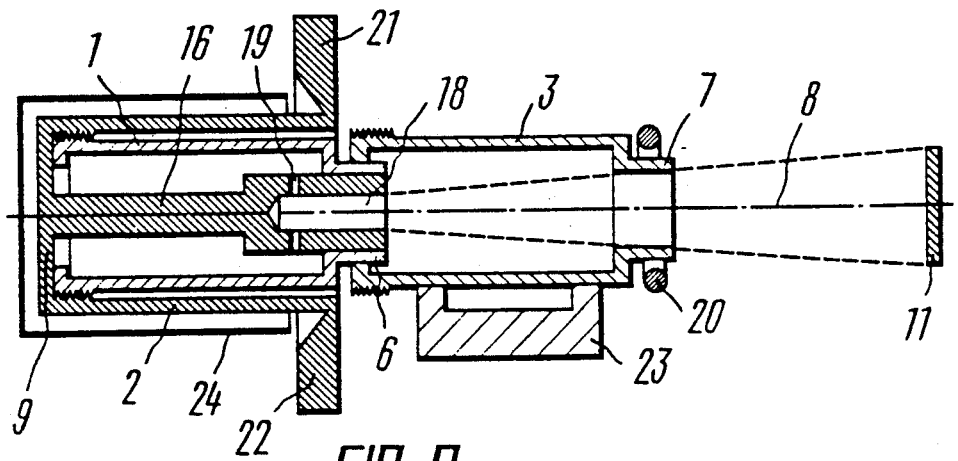
FIG. 3 is ditto of FIG. 2 showing another embodiment of the former of a directional vapour flow, with a sealing member integral with a heating element and with an additional heating element in a longitudinal section view, according to the invention.

In another embodiment of the apparatus shown in FIG. 3, the distal end of the rod 16 is positioned adjacent to the inner surface of the pipe socket 6 of the evaporation chamber 1. In this case the rod 16 has an axial passage 18, and a plurality of ports in the periphery of the rod 16 communicating therewith.

In this embodiment of the apparatus there is provided a second heating element 20 positioned outside, and along the periphery of the pipe socket 7 of the collimating chamber 3. It may also be made of a high-melting metal and connected to current leads (not shown in the drawing). The heating element 20 ensures a temperature rise of the pipe socket 7 above melting point of the coating material 10 at regular intervals (FIG. 1) for returning the material to the collimating chamber 3 so as to coat the substrate 11 with a thicker film without impairing its quality.

In this embodiment the heating element 2 (FIG. 3) is made integral with the sealing member 9 so as to guarantee the heating of the sealing member 9 which should be at a temperature at least equal to that in the evaporation chamber 1.

The heating element 2 has taps 21 and 22 to attach it to current leads (not shown in the drawing). A slit (not shown in the drawing) is made axially along the heating element 2 to ensure an optimum distribution of electric current over the whole surface of the heating element 2. The heating element 2 and the sealing member 9 and taps 21, 22 may be made of graphite.

The evaporation chamber 1 may be connected to the sealing member 9 by means of a threaded joint ensuring a reliable sealing of the chamber 1. The collimating chamber 3 is mounted on a support 23, and a thermal screen 24 made of a high-melting sheet metal is provided adjacent to the heating element 2 and sealing member 9 to reduce heat radiation.

The apparatus for forming films functions in the following manner.

The coating material 10 is charged in the chamber 1 for evaporation (FIG. 1). After placing the support 11 and the whole apparatus into a vacuum chamber (not shown in the drawing), air is evacuated therefrom to a working pressure. Then the heating element 2 is switched on. Temperature in the evaporation chamber 1 increases, and the material 10 available therein is heated to a temperature necessary for its evaporation. The resultant vapour escapes through the pipe socket 6 and a part of it passes through the pipe socket 7 to be deposited on the substrate, the part that failed to get to the substrate 11 being condensed on the inner surface of the collimating chamber 3.

After forming a film of the desired thickness on the substrate 11, the heating element 2 is switched off. Then the coating material 10 is charged into the collimating chamber 3 if necessary, and the chambers 1 and 3 are exchanged. Thus, the coating material 10 deposited on the walls of the collimating chamber 3 is used in the next coating cycle together with the fresh-charged material.

The apparatus in which the sealing member 9 and chambers 1, 3 are mounted on the arm 13 (FIG. 2) by means of the pin 12 and spring 14 functions in the same manner. This apparatus ensures a more uniform film thickness as vapour flow escaping through the space 17 and having an annular configuration turns into a solid-section flow as it passes through the collimating chamber 3. The peripheral areas of the flow are condensed on the walls of the chamber 3, and the central portion thereof reaches the substrate 11 to form a uniform thickness film thereon. This apparatus having the rod 16 the end of which is received in the pipe socket 6 to define a space 17 is preferably used for forming films on large-size substrates with the ratio of their diameter to the distance from the pipe socket 6 greater than 0.4.

The apparatus shown in FIG. 3 functions in a similar manner. The distinguishing feature of this apparatus resides in that the evaporated material is admitted from the evaporation chamber 1 to the collimating chamber 3 through the ports 19 in the periphery of the rod 16 and axial passage 18 of the distal end of the rod 16. After the escape from the passage 18, a directional diverging vapour flow is formed so as to enable formation of films on substrates 11 of various sizes.

If a film of a large thickness is to be formed on the substrate 11, the heating element 20 is switched on at regular intervals during coating so as to melt the layer of the coating material deposited in the pipe socket 7 and to cause it to overflow to the collimating chamber 3 to prevent the inside diameter of the pipe socket 7 from decreasing which might result in a lower coating rate and impaired uniformity of film thickness.

Therefore, the apparatus for forming films by evaporation in vacuum, according to the invention, allows films to be formed on vertical substrates and ensures high uniformity of film thickness with a low material consumption.

INDUSTRIAL APPLICABILITY

The apparatus for forming films by evaporation in vaccum preferably of valuable materials such as gold, silver, platinum, palladium may be used in the electronic and radio engineering and acoustics, e.g. in the manufacture of integrated circuits as well as for metal-coating and for tuning of quarz resonators in vacuum.

We claim:

1. An apparatus for forming films by evaporation in vacuum, comprising a chamber (1) for evaporating a coating material, a heating element (2) provided outside the evaporation chamber, and a collimating chamber (3) communicating therewith, the chambers being identically constructed and each having a pair of ports (4, 5) which are aligned on one and the same axis (8), characterized in that the axis (8) of the ports (4, 5) extends horizontally, the chamber (1) for evaporating a coating material and the collimating chamber (3) each has a pipe socket (6, 7) positioned on one of their ports, the pipe socket (6) of the chamber (1) for evaporating a coating material being received in the other port (5) of the collimating chamber (3), the chamber (1) for evaporating a coating material being provided with sealing member (9) provided in the other port (4) thereof, the coating material (10) being contained directly in the chamber (1) for evaporating the coating material.

2. An apparatus for forming films by evaporation in vaccum, according to claim 1, characterized in that it comprises a directional vapour flow former in the form of a rod (16) positioned along the axis (8) of the ports (4) of the chamber (1) for evaporating the coating material and attached to the sealing member (9) thereof.

3. An apparatus for forming films by evaporation in vaccum according to claim 2, characterized in that the distal end of the rod (16) is received in the pipe socket (6) of the chamber (1) for evaporating the coating material to define a space (17) with its inner surface.

4. An apparatus for forming films by evaporation in vacuum according to claim 2, characterized in that the distal end of the rod (16) is positioned adjacent to the inner surface of the pipe socket (6) of the chamber (1) for evaporating the coating material, the rod (16) having an axial passage (18) and a plurality of ports (19) in the periphery of the rod (16) communicating with its axial passage.

5. An apparatus for forming films by evaporation in vacuum according to claim, characterized in that it comprises an additional heating element (20) positioned outside, and along the periphery of the pipe socket (7) of the collimating chamber (3).

6. An apparatus for forming films by evaporation in vacuum according to claim 1, characterized in that the sealing member (9) is made integral with the main heating element (2).

7. An apparatus for forming films by evaporation in vacuum according to claim 5, characterized in that the sealing member (9) is made integral with the main heating element (2).

* * * * *